(12) United States Patent
Saito et al.

(10) Patent No.: US 7,225,004 B2
(45) Date of Patent: May 29, 2007

(54) MOBILE COMMUNICATION TERMINAL

(75) Inventors: Yuichiro Saito, Tokyo (JP); Hideaki Shoji, Chiba (JP); Yoshiki Uchida, Saitama (JP)

(73) Assignee: Sony Ericsson Mobile Communications Japan, Inc., Tokyo (JP)

( * ) Notice: Subject to any disclaimer, the term of this patent is extended or adjusted under 35 U.S.C. 154(b) by 17 days.

(21) Appl. No.: 10/542,069

(22) PCT Filed: Nov. 5, 2004

(86) PCT No.: PCT/JP2004/016801

§ 371 (c)(1),
(2), (4) Date: Jul. 12, 2005

(87) PCT Pub. No.: WO2005/050780

PCT Pub. Date: Jun. 2, 2005

(65) Prior Publication Data

US 2006/0094484 A1    May 4, 2006

(30) Foreign Application Priority Data

Nov. 18, 2003  (JP) ............................. 2003-388099
Apr. 30, 2004  (JP) ............................. 2004-136271

(51) Int. Cl.
*H04M 1/00* (2006.01)
*H04B 1/38* (2006.01)

(52) U.S. Cl. .................. 455/575.7; 455/575.1; 455/575.5; 455/550.1; 455/90.3; 455/556.2

(58) Field of Classification Search .. 455/575.1–575.8, 455/550.1, 11.1, 13.3, 19–25, 63.4, 81–83, 455/556.1, 95, 97, 106–107, 121, 274, 128–129, 455/193.1, 268–269, 279.1, 73, 63.1, 78, 455/88, 66.1, 67.11, 90.3, 127.2, 556.2, 562.1, 455/272–275; 343/700 R, 701–703, 714–715, 343/782, 787, 845, 907, 872–873, 700 MS, 343/727–728, 748, 750, 764–765, 767, 769, 343/829, 895, 841–842, 846, 848, 906–908; 342/153, 403, 406, 74, 419, 410–412, 447–448; 375/315

See application file for complete search history.

(56) References Cited

U.S. PATENT DOCUMENTS

| 5,826,201 | A  | * | 10/1998 | Gratias ..................... 455/575.5 |
| 5,859,617 | A  | * | 1/1999  | Fujikawa .................... 343/702 |
| 6,031,495 | A  | * | 2/2000  | Simmons et al. ............ 343/702 |
| 6,133,880 | A  | * | 10/2000 | Grangeat et al. .... 343/700 MS |
| 6,204,817 | B1 | * | 3/2001  | Edvardsson ................. 343/702 |
| 6,507,318 | B2 | * | 1/2003  | Ito et al. ..................... 343/702 |
| 6,559,803 | B2 | * | 5/2003  | Shinichi ..................... 343/702 |
| 2002/0005803 | A1 | * | 1/2002 | Baugh et al. ............... 342/453 |

FOREIGN PATENT DOCUMENTS

| JP | 10-117106     | 5/1998  |
| JP | 2001-257522   | 9/2001  |
| JP | 2002-512463   | 4/2002  |
| JP | 2003-273767   | 9/2003  |
| JP | 2003-332938   | 11/2003 |
| JP | 2004-40524    | 2/2004  |

* cited by examiner

*Primary Examiner*—Meless Zewdu
(74) *Attorney, Agent, or Firm*—Oblon, Spivak, McClelland, Maier & Neustadt, P.C.

(57) ABSTRACT

A mobile phone unit is provided in which a characteristic of an antenna is improved and SAR is reduced without lowering an antenna gain during communication. An antenna 26

(electrical length λ/4), an antenna connection conductive member 22 (electrical length λ/4) that is a circuit board connected to the antenna 26, an opposite side conductive member 42 that is a circuit board opposed to the antenna connection conductive member 22, and an electric connection portion 24 that electrically connects an edge portion 222, which is on the opposite side to the antenna 26, of the antenna connection conductive member 22 and an opposite side edge portion 422, which is opposed to the edge portion 222, of the opposite side conductive member 42 (electrical length λ/4) are included. A gain on the opposite side to an LCD side casing 4 becomes large when seen from the antenna 26, and the electric currents are counteracted to be small and consequently a gain becomes small on the side of the LCD side casing 4.

18 Claims, 11 Drawing Sheets

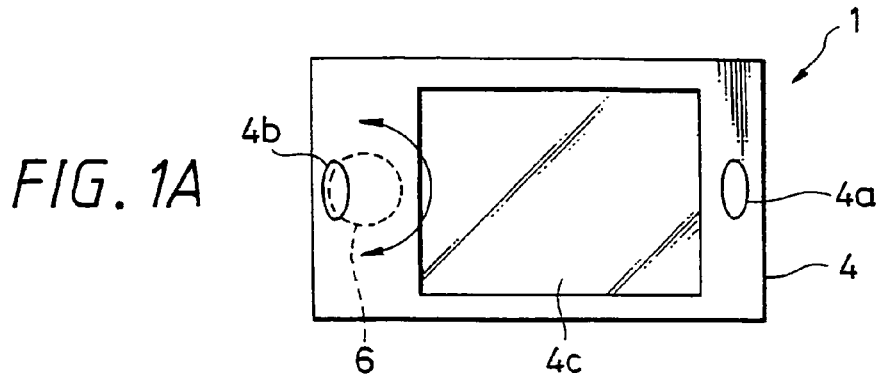
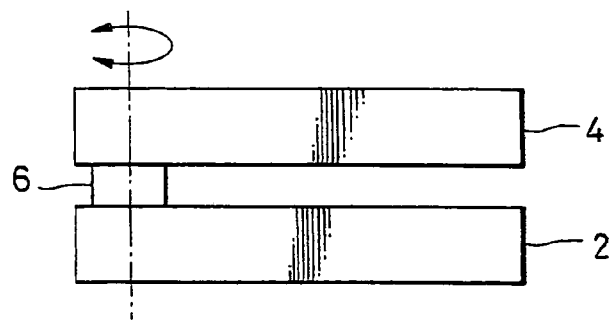
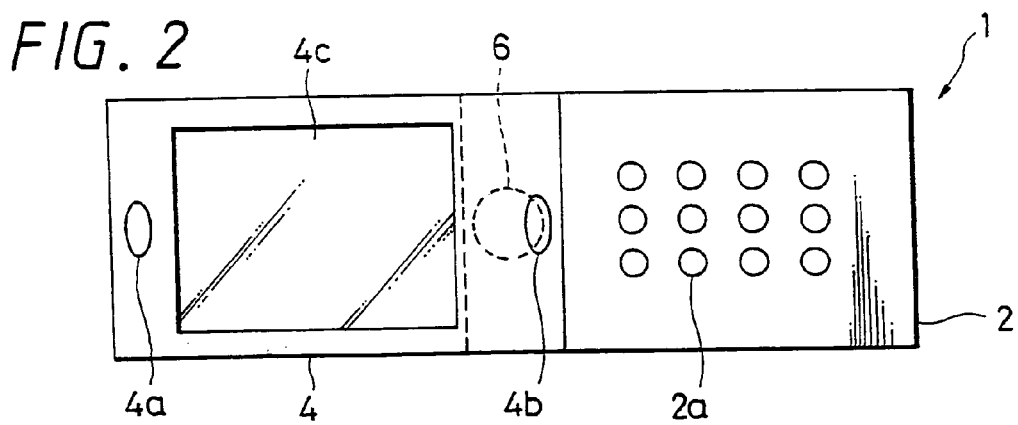
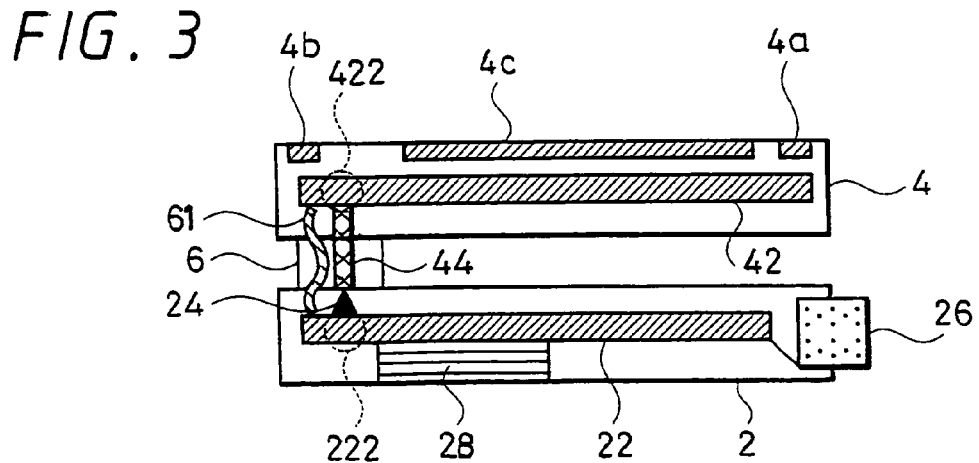

MOBILE COMMUNICATION TERMINAL

TECHNICAL FIELD

The present invention relates to a mobile communication terminal such as a mobile phone unit, and particularly to a technology of reducing SAR (Specific Absorption Rate) in the mobile communication terminal.

BACKGROUND ART

At present, wireless communication, for example, a telephone call using a mobile wireless communication terminal such as a mobile phone unit and the like is performed. An electromagnetic wave is radiated from an antenna of a mobile phone unit when making a telephone call. A part of the electromagnetic wave radiated is absorbed by the user using the mobile phone unit. It is desirable that the electromagnetic wave absorbed into the human body is low. Here, as one of the indices that show the amount of the absorption of the electromagnetic wave into the human body, there is the SAR that is the absorption rate of the electromagnetic wave energy applied to a specific portion of the human body. Hence, it is desirable that the SAR be reduced. However, if the electromagnetic wave radiated from an antenna is reduced just because the reduction of the SAR is desired, an antenna gain during a telephone call is dropped to cause a disadvantage to the telephone call.

Thus, it is preferable not to lower the antenna gain during a telephone call while improving the characteristic of the antenna and reducing the SAR. Hereupon, one in which the characteristic of the antenna is improved to control the interference between the antennas (refer to Published Japanese Patent Application No. 2003-163521), and one in which the reduction of the influence of the casing to the antenna (refer to Published Japanese Patent Application No. H9-270728) are proposed.

However, there is no such thing as the characteristic of the antenna is improved and the antenna gain during a telephone call is held while reducing the SAR.

Therefore, the present invention aims not to lower an antenna gain during a telephone call while reducing the SAR by improving the characteristic of the antenna.

DISCLOSURE OF THE INVENTION

The first aspect of the present invention is a mobile communication terminal including: an antenna, an antenna connection conductive member connected to the antenna, an opposite side conductive member opposed to the antenna connection conductive member, and an electric connection member which electrically connects an edge portion, which is on the opposite side to the antenna, of the antenna connection conductive member and an opposite side edge portion, which is opposed to a vicinity of the edge portion, of the opposite side conductive member.

The second aspect of the present invention is a mobile communication terminal according to the first aspect of the present invention, wherein the electric connection member connects a ground potential portion of the antenna connection conductive member and a ground potential portion of the opposite side conductive member.

The third aspect of the present invention is a mobile communication terminal according to the first aspect of the present invention, further including a casing which accommodates the opposite side conductive member, and the casing has a voice output means which outputs the voice on the side opposite to the antenna connection conductive member when seen from the opposite side conductive member.

The fourth aspect of the present invention is a mobile communication terminal according to the first aspect of the present invention, wherein the electric connection member performs (1) no operation of connecting the edge portion and the opposite side edge portion, while waiting for communication, and (2) operation of connecting the edge portion and the opposite side edge portion during communication.

The fifth aspect of the present invention is a mobile communication terminal according to the first aspect of the present invention, wherein the electric connection member performs (1) operation of connecting the edge portion and the opposite side edge portion, and further operation of electrically connecting an edge vicinity portion in the vicinity of the edge portion of the antenna connection conductive member and a opposite side edge vicinity portion of the opposite side conductive member, which is opposed to the edge vicinity portion, while waiting for communication, and (2) operation of connecting the edge portion and the opposite side edge portion and no operation of connecting the edge vicinity portion and the opposite side edge vicinity portion during communication.

The sixth aspect of the present invention is a mobile communication terminal according to the first aspect of the present invention, wherein the total electrical length of the antenna connection conductive member and the opposite side conductive member is half the wavelength of a radio wave used for communication.

The seventh aspect of the present invention is a mobile communication terminal according to the first aspect of the present invention, wherein the total electrical length of the antenna connection conductive member and the opposite side conductive member is quarter the wavelength of a radio wave used for communication.

The eighth aspect of the present invention is a mobile communication terminal according to the first aspect of the present invention, wherein a frequency adjusting member is attached to the electric connection member.

The ninth aspect of the present invention is a mobile communication terminal according to the eighth aspect of the present invention, wherein the frequency adjusting member is formed of at least one of circuit components of a resistor, a capacitor and a coil.

The tenth aspect of the present invention is a mobile communication terminal including: radio wave radiation means, radio wave radiation connection conductive means connected to the radio wave radiation means, opposite side conductive means opposed to the radio wave radiation connection conductive means, and electric connection means which electrically connects a vicinity of the edge portion on the opposite side to the radio wave radiation means in the radio wave radiation connecting conductive means and a vicinity of the opposite side edge portion of the opposite side conductive member, which is opposed to the vicinity of the edge portion.

BRIEF DESCRIPTION OF DRAWINGS

FIGS. 1A and 1B show an example of a mobile phone unit (mobile communication terminal) according to a first embodiment of the present invention, in which FIG. 1A is a plan view and FIG. 1B is a front view;

FIG. 2 is a plan view of an example of a mobile phone unit, in which an LCD side casing is rotated around a hinge as an axis;

FIG. 3 is a front sectional view of an example of a mobile phone unit according to the first embodiment of the present invention;

FIGS. 8A and 8B are sectional views of an example of a mobile phone unit according to a second embodiment of the present invention, in which FIG. 8A shows the time of waiting for communication (not connected) and FIG. 8B shows the time of communication (connected);

FIGS. 9A and 9B are sectional views of an example of a mobile phone unit according to a third embodiment of the present invention, in which FIG. 9A shows the time of communication (one connected) and FIG. 9B shows the time of waiting for communication (both connected);

FIGS. 10A and 10B show an example of a mobile phone unit (mobile communication terminal) according to a fourth embodiment of the present invention, in which FIG. 10A shows a front view and FIG. 10B shows a side sectional view;

FIGS. 11A to 11C show an example of a mobile phone unit (mobile communication terminal) according to a fifth embodiment of the present invention, in which FIG. 11A is a plan view, FIG. 11B is a front view and FIG. 11C is a front sectional view;

BEST MODE FOR CARRYING OUT THE INVENTION

Figure 4:
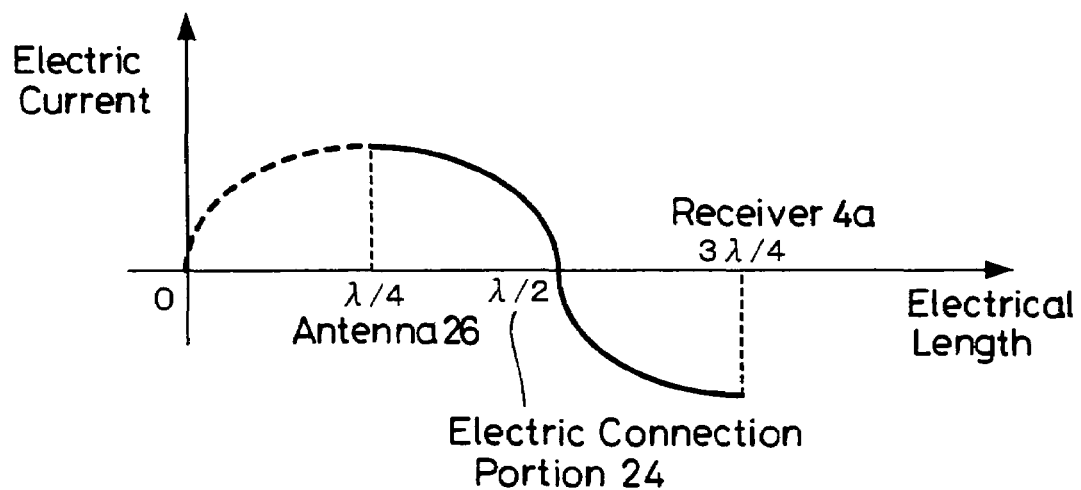
FIG. 4 is a characteristic curve showing an example of electric current distribution of a mobile phone unit according to the first embodiment of the present invention.

Hereinafter, embodiments of the present invention will be explained with referring to the drawings.

First Embodiment

FIGS. 1A and 1B show a mobile phone unit (mobile communication terminal) 1 according to the first embodiment of the present invention, in which FIG. 1A is a plan view and FIG. 1B is a front view.

The mobile phone unit 1 includes a key button side casing 2, an LCD side casing 4 and a hinge 6. The key button side casing 2 and the LCD side casings 4 are opposed to each other with a small space in between and are joined by the hinge 6. The hinge 6 is disposed in the space between the key button side casing 2 and the LCD side casing 4 on the edges of the key button side casing 2 and LCD side casing 4. The LCD side casing 4 is capable of rotating around the hinge 6 as an axis. The direction of the axis of the rotation is vertical to the surface of the key button side casing 2 opposed to the LCD side casing 4.

The LCD side casing 4 includes a receiver (voice output means) 4a, a microphone 4b and an LCD 4c on the opposite side surface to the surface opposed to the key button side casing 2. The receiver (voice output means) 4a outputs voice. It is provided mainly for a user of the mobile phone unit 1 to hear the voice of the other end of the line. The user of the mobile phone unit 1 can hear the voice of the other end of the line by applying the receiver 4a to an ear. The microphone 4b is provided to convert the voice of the user of the mobile phone unit 1 into an electric signal. The LCD 4c is a liquid crystal display to display the message and so on.

FIG. 2 is a plan view of the mobile phone unit 1, when the LCD side casing 4 is rotated around the hinge 6 as an axis. When the LCD side casing 4 is rotated around the hinge 6 as an axis, the key buttons 2a (ten-key buttons and the like) provided on the key button side casing 2 can be shown. A telephone call may be made in the state shown in FIG. 2. However, the mobile phone unit 1 can wait for phone calls and make the phone calls in the state shown in FIG. 1. Therefore, in the following description the explanation will be made assuming that phone calls are waited and performed in the state shown in FIG. 1.

FIG. 3 is a front sectional view of the mobile phone unit 1 according to the first embodiment of the present invention.

The key button side casing accommodates an antenna connection conductive member 22, an electric connection portion 24, an antenna 26 and a battery 28.

The antenna connection conductive member 22 is a circuit board on which various electric circuits are mounted. The antenna 26 that is electromagnetic wave radiation means is connected to the antenna connection conductive member 22. Hereupon, if the wave-length of a radio wave that the mobile phone unit 1 uses for the communication (telephone call) is $\lambda$, $\lambda/4$ is the electrical length of the antenna connection conductive member 22, that is, the electrical length from a point where the antenna connection conductive member 22 and the antenna 26 are connected to an edge portion 222 described later on.

The electric connection portion 24 is a member by which a ground potential portion in the vicinity of the edge portion 222 of the antenna connection conductive member 22 and a ground potential portion in the vicinity of an opposite side edge portion 422 of the opposite side conductive member 42 are electrically connected through a connection pattern 44. As the electric connection portion 24, a coil spring, a gasket and various other members that are usually used for the electric connection can be used. Note that the edge portion 222 is an edge portion, which is on the opposite side to the antenna, of the antenna connection conductive member 22. Further, with respect to the antenna connection conductive member 22 and the opposite side conductive member 42, a circuit between both the circuit boards is electrically connected to be capable of performing signal communication by wiring means 61 such as a flexible circuit board not illustrated. The ground potential portions of both the circuit boards are also connected using the wiring means 61.

The antenna 26 is an antenna to perform communication. The electrical length of the antenna 26 is $\lambda/4$. Further, a feed point of the antenna 26 is in the vicinity of the antenna 26.

The battery 28 is a power source of the mobile phone unit 1.

The LCD side casing 4 accommodates the opposite side conductive member 42.

The opposite side conductive member 42 is a circuit board on which various electric circuits are mounted. The opposite side conductive member 42 is opposed to the antenna connection conductive member 22. The electrical length of the opposite side conductive member 42, that is, the electrical length to the opposite side edge portion 422 from an edge of the opposite side conductive member 42, which is on the opposite side to the edge portion of the other side 422, is $\lambda/4$. The opposite side edge portion 422 of the opposite side conductive member 42 is opposed to the edge portion 222 of the antenna connection conductive member 22. A connection pattern 44 is connected to the opposite side edge portion 422. The connection pattern 44 passes through the hinge 6 and is connected to the electric connection portion 24. Further, the receiver 4a is disposed in the vicinity of the edge of the opposite side conductive member 42 on the opposite side to the opposite side edge portion 422.

Next, the operation of the first embodiment is explained.

When communication is performed using the mobile phone unit 1, power is supplied to the antenna 26. The feed point of the antenna 26 is in the vicinity of the antenna 26. Further, the electrical length of the antenna 26 and antenna connection conductive member 22 is $\lambda/4$. Therefore, the electric current distribution of the antenna 26 and antenna connection conductive member 22 becomes similar to a $\lambda/2$ wavelength dipole antenna (center feeding type) as shown in FIG. 4. In other words, the electric current becomes maximum in the vicinity of the antenna 26 (the electrical length $\lambda/4$). Therefore, a gain on the opposite side (back side) to the LCD side casing 4 becomes large when seeing from the antenna 26. Further, the electric current becomes minimum in the vicinity of the electric connection portion 24 (the electrical length $\lambda/2$). Furthermore, the electrical length of the opposite side conductive member 42 is $\lambda/4$. Therefore, the electric current in the vicinity of the receiver 4a (the electrical length $3\lambda/4$) is approximately the same as that in the vicinity of the antenna 26 (the electrical length $\lambda/4$) with reverse polarity. Accordingly, on the side of the LCD side casing 4 (front side) when seeing from the antenna 26, the electric current counteracts each other to be small and a gain becomes small.

Figure 5:
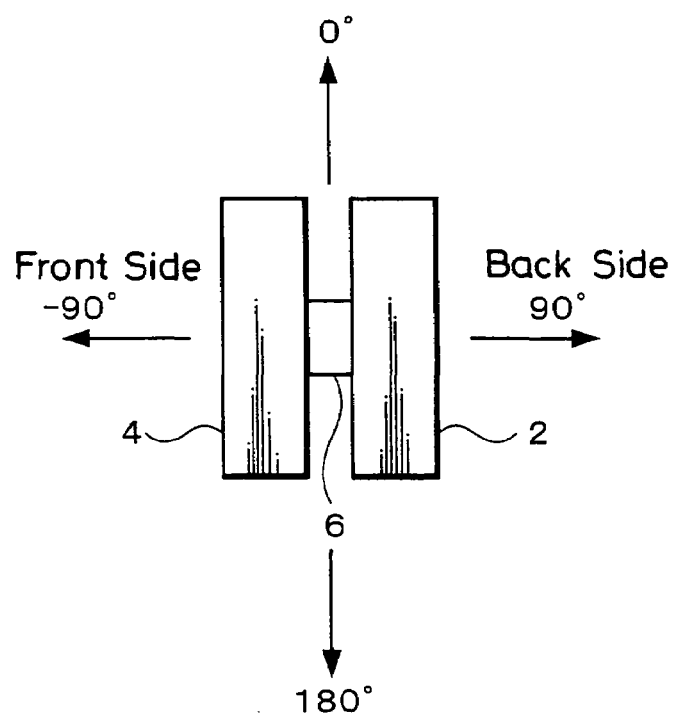
FIG. 5 is an explanatory view that defines directions regarding a mobile phone unit according to the first embodiment of the present invention.
Figure 6:
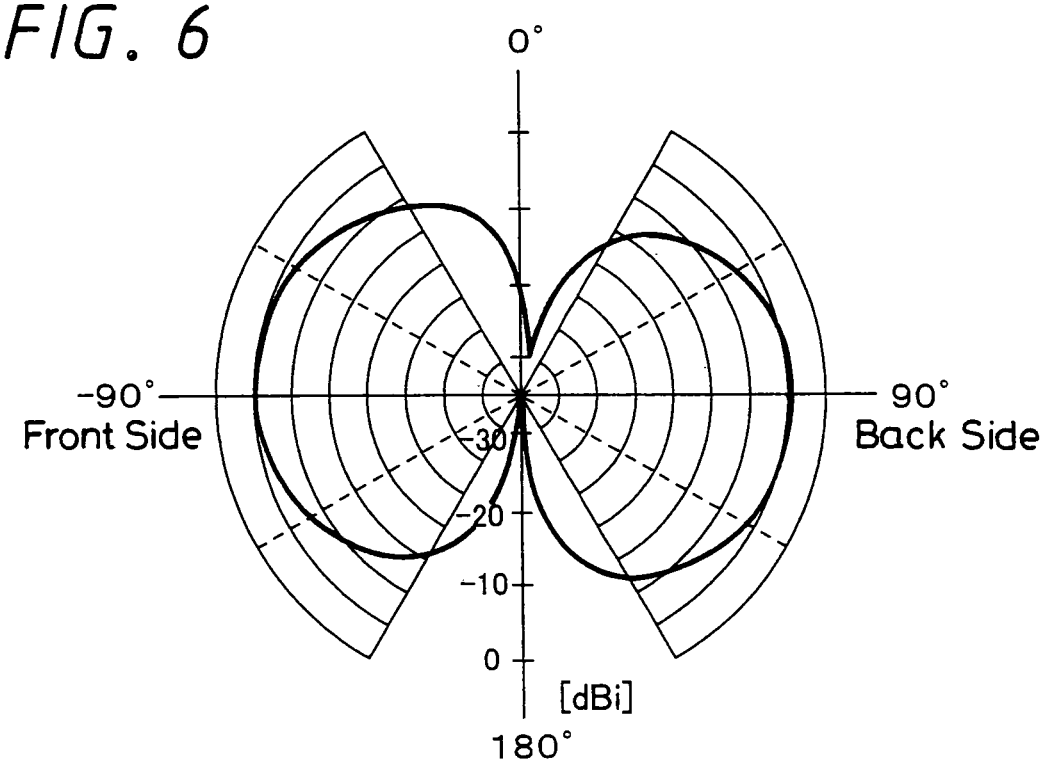
FIG. 6 is a characteristic diagram showing an example of the antenna characteristic assuming that there is no electric connection portion.
Figure 7:
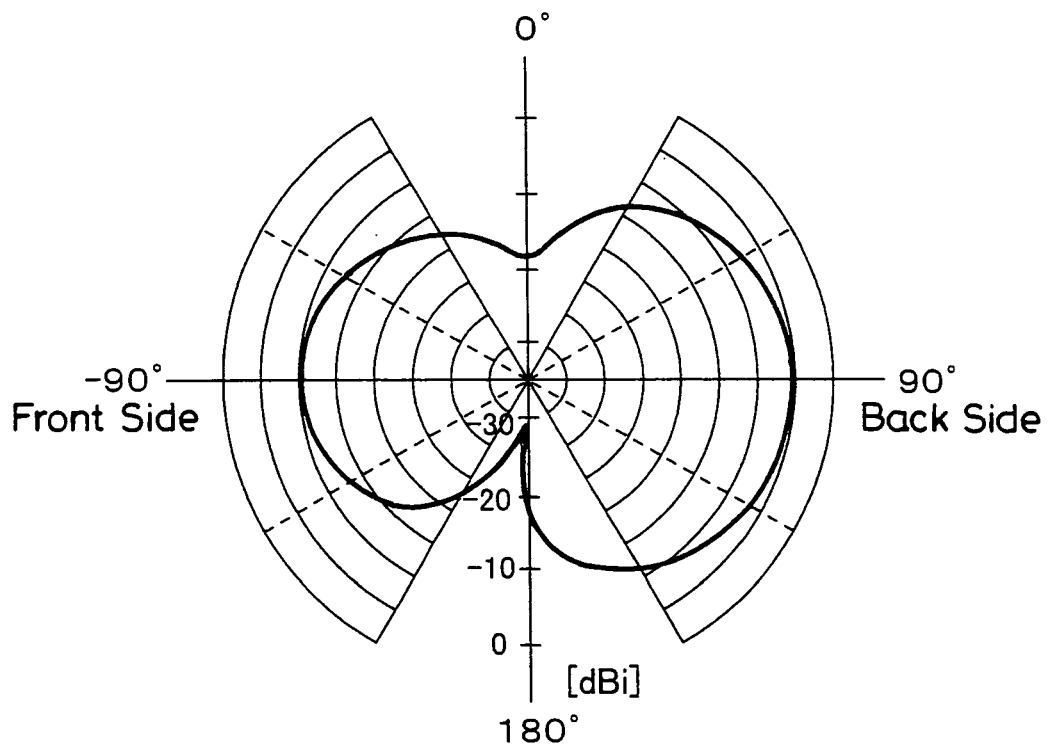
FIG. 7 is a characteristic diagram showing an example of the antenna characteristic according to the first embodiment of the present invention.

Here, directions are defined as shown in FIG. 5. FIG. 6 is a diagram showing a characteristic of an antenna, when assumed that the electric connection portion 24 is not provided. The radio wave is almost similarly radiated to the front side and the back side. There is the receiver 4a on the front side, and an ear of the user is brought to contact with the receiver 4a. Therefore, the user is exposed to the radio wave of the same level as the back side. FIG. 7 is a diagram showing the antenna characteristic according to the first embodiment of the present invention. The radio wave radiated to the front side is less than that radiated to the back side. Therefore, the user is exposed to the radio wave of the lower level than that of the back side. This leads to the SAR reduction. Further, the radio wave radiated to the back side is almost equal to that of FIG. 6. Therefore, the antenna gain during communication is not considerably reduced.

According to the first embodiment, when seeing from the antenna 26, the electric currents counteract each other to be small, and the gain becomes small on the side of the LCD side casing 4 (front side). Therefore, the SAR is made to be reduced. Further, when seeing from the antenna 26, a gain on the opposite side to the LCD side casing 4 (back side) becomes large. Therefore, the antenna gain during communication is not considerably reduced.

Second Embodiment

In the second embodiment, the connection state of the electric connection portion 24 is changed between the time of waiting for communication (not connected) and the time of communication (connected), which is different from the first embodiment.

An outer appearance of a mobile phone unit 1 according to the second embodiment is the same as that shown in FIGS. 1 and 2.

Figure 8A:
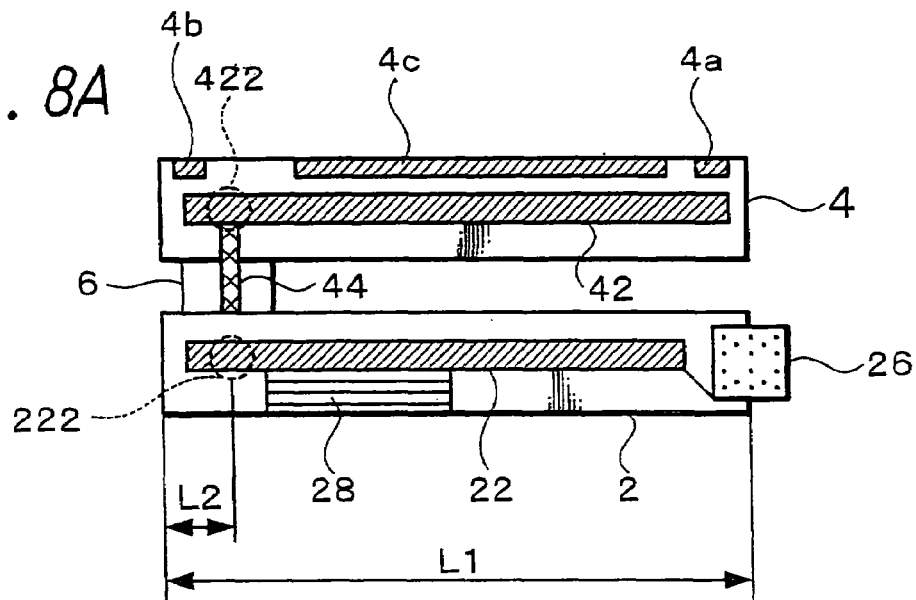
Figure 8B:
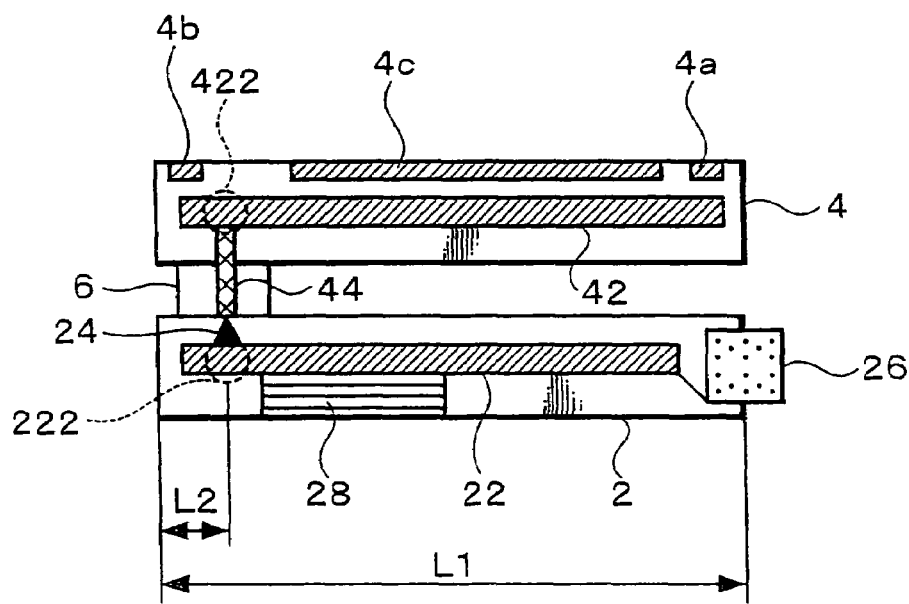

FIGS. 8A and 8B are sectional views of the mobile phone unit 1 according to the second embodiment of the present invention, in which FIG. 8A shows the time of waiting for communication (not connected) and FIG. 8B shows the time of communication (connected).

As shown in FIG. 8A, the antenna connection conductive member 22 and the opposite side conductive member 42 are not connected through the electric connection portion 24 in the time waiting for the communication (telephone call). On the other hand, as shown in FIG. 8B, the antenna connection conductive member 22 and the opposite side conductive member 42 are connected through the electric connection portion 24 in the time of communication. However, the two conductive members 22, 42 are connected through wiring means (not illustrated in FIG. 8) such that the signal communication can constantly be performed. Note that the other portions are the same as those of the first embodiment, and the same numerals are given to the same portions and the explanation thereof is omitted.

Next, the operation of the second embodiment is explained. When the mobile phone unit 1 is waiting for communication (telephone call) (refer to FIG. 8B), the feed point of the antenna 26 is in the vicinity of the antenna 26. Further, the electrical length of the antenna 26 and the antenna connection conductive member 22 is $\lambda/4$. Therefore, the electric current distribution of the antenna 26 and the antenna connection conductive member 22 becomes similar to a $\lambda/2$ wavelength dipole antenna (center feed type). In other words, the electric current becomes maximum in the vicinity of the antenna 26 (the electrical length $\lambda/4$). Therefore, when seeing from the antenna 26, a gain on the opposite side to the LCD side casing 4 (back side) becomes large. Further, the electric current becomes minimum in the vicinity of the electric connection portion 24 (the electrical length $\lambda/2$).

Hereupon, the antenna connection conductive member 22 and the opposite side conductive member 42 are not connected. Therefore, the antenna connection conductive member 22 and the opposite side conductive member 42 cause the capacity coupling. Accordingly, the electric current becomes minimum in the vicinity of the opposite side edge portion 422 of the opposite side conductive member 42 and the electric current becomes maximum in the vicinity of the receiver 4a. Hence, a gain becomes also large on the side of the LCD side casing 4 (front side) when seeing from the antenna 26.

Therefore, almost the same antenna characteristic is shown on the front side and on the back side when waiting for the communication (telephone call). Hence, if the radio wave comes (radiates) either from the front side or from the back side, the reception (transmission) can be performed favorably, which is suitable to wait for the communication (telephone call).

On the other hand, the operation when performing the communication using the mobile phone unit 1 is similar to that of the first embodiment. For example, in FIGS. 8A and 8B, L1 (whole length of the key button side casing 2) is 105 mm and L2 (the distance from the end surface (the opposite side to the antenna 26) of the key button side casing 2 to the electric connection portion 24) is 45 mm and the radio wave of the 800 MHz band is used for the communication (telephone call). The characteristics of the antenna are as follows.

TABLE 1

|  | Front side | Back side | During communication |
|---|---|---|---|
| Without the electric connection portion 24 | −5 dBi | −5 dBi | −15 dBi |
| With the electric portion 24 | −8 dBi | −5 dBi | −12 dBi |

According to the above table, without the electric connection portion 24 (refer to FIG. 8A), almost the same antenna characteristic is shown on the front side and on the back side to be suitable for waiting for the communication (telephone call). With the electric connection portion 24 (refer to FIG. 8B), the antenna characteristic during communication is favorable, which is suitable for the time of communication.

According to the second embodiment, when waiting for the communication (telephone call), the electric connection portion 24 is not provided and the antenna connection conductive member 22 and the opposite side conductive member 42 are not connected, so that almost the same antenna characteristic is shown on the front side and on the back side. Therefore, it is suitable to wait for communication (telephone call). Furthermore, the same effectiveness as the first embodiment is obtained during communication.

In addition, whether the electric connection portion 24 is connected or not is changed between the time of waiting for communication and the time of the communication in the above explanation, however, the switching may be performed by the opening and closing (the change between the states of FIGS. 1 and 2) of the two casings 2 and 4.

Third Embodiment

In the third embodiment, the electric connection portions 24a, 24b are provided instead of the electric connection portion 24 and the connection states thereof are changed between the time of waiting for communication (both connected) and the time of communication (one connected), which is different from the first embodiment.

An outer appearance of a mobile phone unit 1 according to the third embodiment is the same as that shown in FIGS. 1 and 2.

Figure 9A:
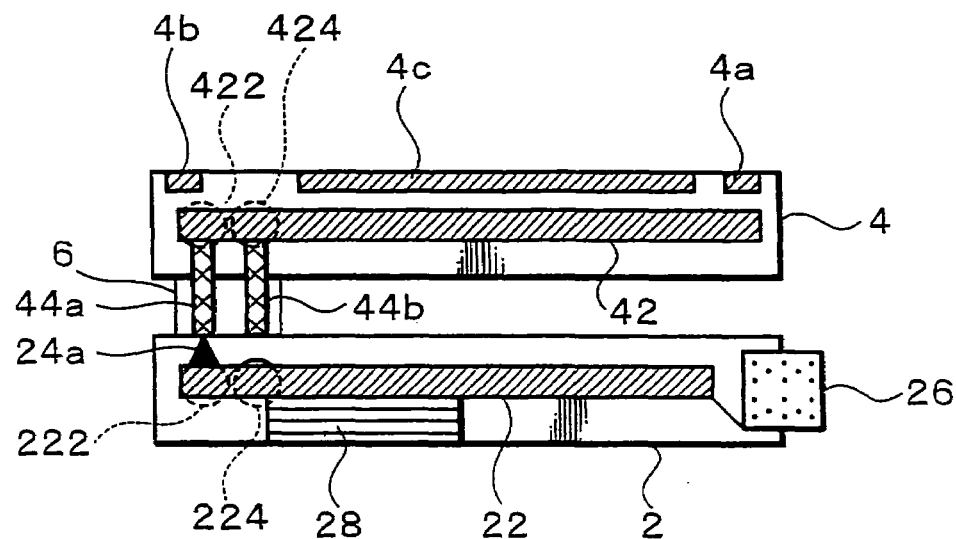
Figure 9B:
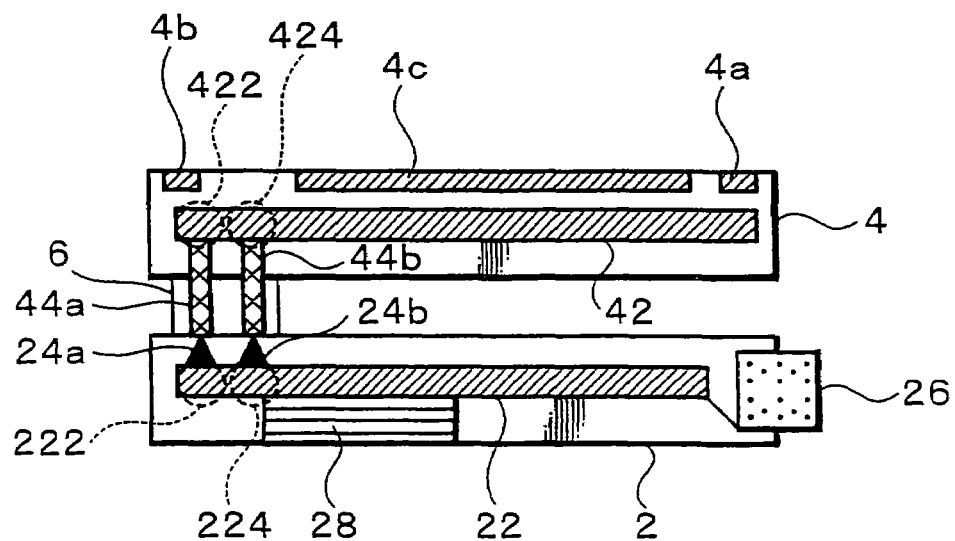

FIGS. 9A and 9B are sectional views of the mobile phone unit 1 according to the third embodiment of the present invention, in which FIG. 9A shows the time of communication (one connected) and FIG. 9B shows the time of waiting for communication (both connected).

The opposite side edge portion 422 of the opposite side conductive member 42 is opposed to the edge portion 222 of the antenna connection conductive member 22. A connection pattern 44a is connected to the opposite side edge portion 422. The connection pattern 44a passes through the hinge 6 and is connected to the electric connection portion 24a. The electric connection portion 24a electrically connects the edge portion 222 of the antenna connection conductive member 22 to the opposite side edge portion 422 of the opposite side conductive member 42 through the connection pattern 44a.

An opposite side edge vicinity portion 424 of the opposite side conductive member 42 is in the vicinity of the opposite side edge portion 422 of the opposite side conductive member 42. An edge vicinity portion 224 of the antenna connection conductive member 22 is in the vicinity of the edge portion 222 of the antenna connection conductive member 22. The opposite side edge vicinity portion 424 is opposed to the edge vicinity portion 224. The electric connection portion 24b electrically connects the edge vicinity portion 224 of the antenna connection conductive member 22 to the opposite side edge vicinity portion 424 of the opposite side conductive member 42 through the connection pattern 44b (refer to FIG. 9B). Further, also in this embodiment, wiring means not illustrated connects the two conductive members 22 and 24 such that the signal communication may constantly be possible.

As shown in FIG. 9A, the edge vicinity portion 224 and the opposite side edge vicinity portion 424 are not connected during communication. The edge portion 222 and the opposite side edge portion 422 are electrically connected by the electric connection portion 24a. On the other hand, as shown in FIG. 9B, when waiting for the communication (telephone call), the edge vicinity portion 224 and the opposite side edge vicinity portion 424 are connected by the electric connection portion 24b. The edge portion 222 and the opposite side edge portion 422 are connected by the electric connection portion 24a. Note that the other portions are the same as those of the first embodiment, and the same numerals are given to the same portions and the explanation thereof is omitted.

Next, the operation of the third embodiment is explained.

When the mobile phone unit 1 is waiting for communication (telephone call) (refer to FIG. 9B), the feed point of the antenna 26 is in the vicinity of the antenna 26. Further, the electrical length of the antenna 26 and the antenna connection conductive member 22 is λ/4. Therefore, the electric current distribution of the antenna 26 and the antenna connection conductive member 22 becomes similar to a λ/2 wavelength dipole antenna (center feed type). In other words, the electric current becomes maximum in the vicinity of the antenna 26 (the electrical length λ/4). Therefore, when seeing from the antenna 26, a gain on the opposite side to the LCD side casing 4 (back side) becomes large. Further, the electric current becomes minimum in the vicinity of the electric connection portion 24 (the electrical length λ/2).

Here, the edge vicinity portion 224 and the opposite side edge vicinity portion 424 are electrically connected by the electric connection portion 24b. The edge portion 222 and the opposite side edge portion 422 are connected by the electric connection portion 24a. Therefore, the antenna connection conductive member 22 and the opposite side conductive member 42 are connected at two positions close to each other. Hence, the antenna connection conductive member 22 and the opposite side conductive member 42 cause the capacity coupling. Accordingly, the electric current becomes minimum in the vicinity of the opposite side edge portion 422 of the opposite side conductive member 42 and becomes maximum in the vicinity of the receiver 4a. Therefore, a gain also becomes large on the side of the LCD side casing 4 (front side), when seeing from the antenna 26.

Therefore, almost the same antenna characteristic is shown on the front side and on the back side when waiting for the communication (telephone call). Hence, if the radio wave comes (radiates) either from the front side or from the back side, the reception (transmission) can be performed favorably, so that it is suitable to wait for the communication (telephone call).

On the other hand, the operation when performing the communication using the mobile phone unit 1 is similar to that of the first embodiment.

According to the third embodiment, the same effectiveness as the second embodiment is obtained.

Fourth Embodiment

In the fourth embodiment, the outer appearance of the mobile phone unit 1 according to the first embodiment is changed to be what is called a stick type (a type of a single casing).

Figure 10A:
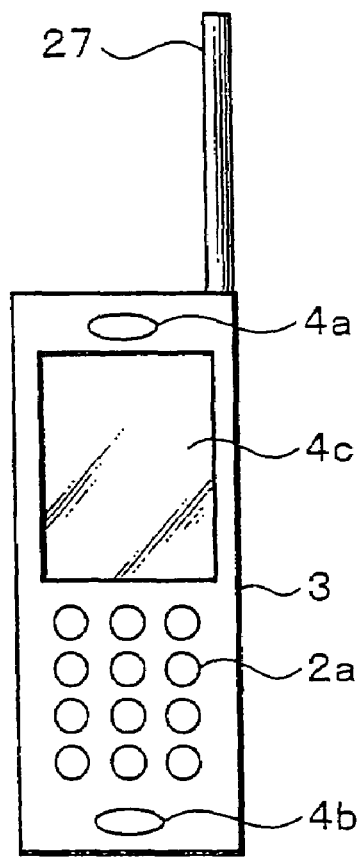
Figure 10B:
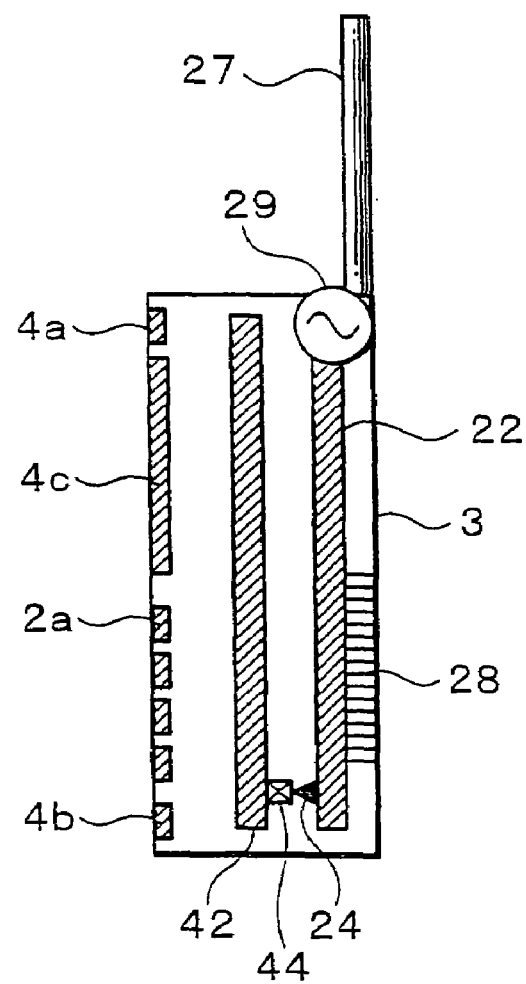

FIGS. 10A and 10B show a mobile phone unit (mobile communication terminal) 1 according to the fourth embodiment of the present invention, in which FIG. 10A is a front view and FIG. 10B is a side sectional view.

As shown in FIGS. 10A and 10B, the mobile phone unit 1 includes a casing 3. As shown in FIG. 10A, a receiver 4a, a microphone 4b, an LCD 4c and a key button 2a are provided on the front surface of the casing 3. Further, as shown in FIG. 10B, an opposite side conductive member 42 is disposed on the front surface side of the casing 3 and a antenna connection conductive member 22 is disposed on the rear surface side of the casing 3. An antenna 27 is connected to the antenna connection conductive member 22 through the feed point 29. The electrical length of the antenna 27 is $\lambda/4$. Further, also in this embodiment, the two conductive members 22, 42 are connected by wiring means not shown such that the signal communication can be constantly performed. Note that the other portions are the same as those of the first embodiment, and the same numerals are given to the same portions and the explanation thereof is omitted.

The operation of the fourth embodiment is almost the same as that of the first embodiment.

Fifth Embodiment

The fifth embodiment is the one in which the circuit boards for packet communication are further provided for the fourth embodiment.

Figure 11C:
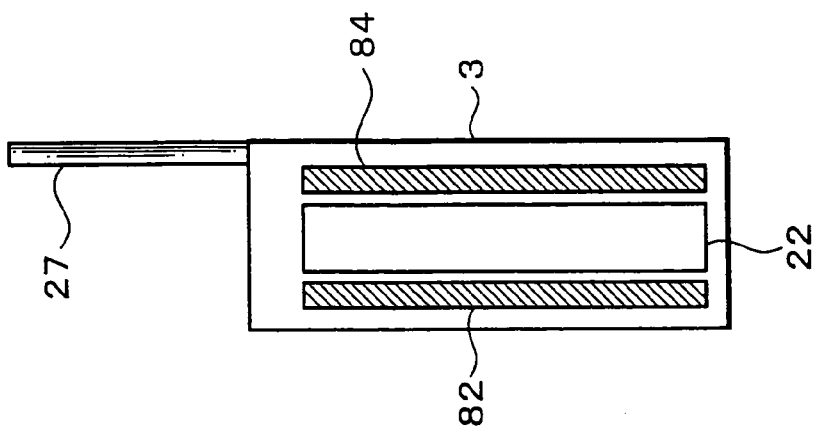
Figure 11B:
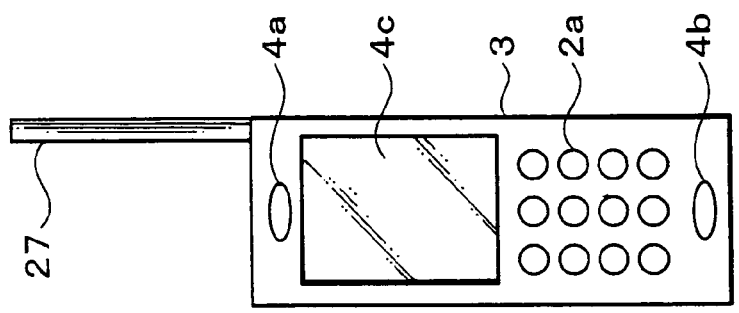
Figure 11A:
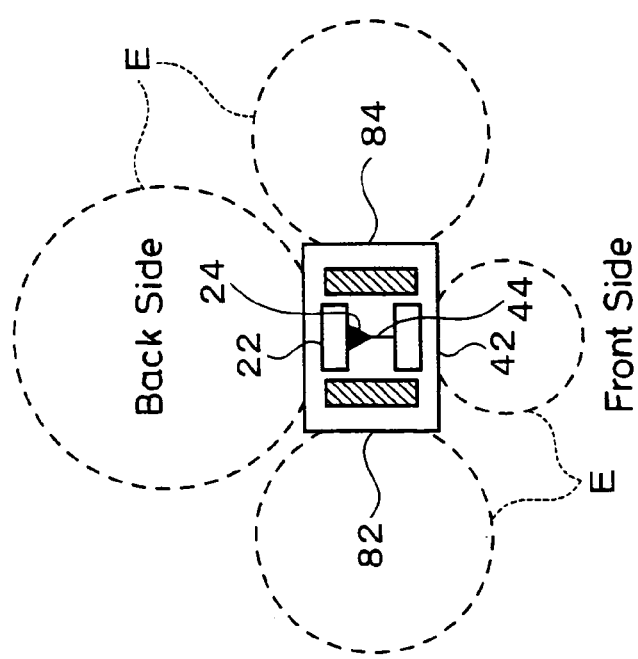

FIGS. 11A to 11C show the mobile phone unit (mobile communication terminal) 1 according to the fifth embodiment of the present invention, in which FIG. 11A is a plan view, FIG. 11B is a front view and FIG. 11C is a front sectional view. Further, in the front sectional view (FIG. 11C), the electric connection portion 24 and the connection pattern 44 are not shown.

The circuit boards 82 and 84 are opposed to each other, and the direction is perpendicular to the direction of the antenna connection conductive member 22. The circuit boards 82 and 84 are used for the packet communication, and the circuit board 82 or the circuit board 84 is connected to the antenna not shown. Further, the circuit board 82 and the circuit board 84 are not connected to each other. Furthermore, also in this embodiment, the two conductive members 22 and 42 are connected by wiring means not shown such that the signal communication can be constantly performed. Note that the other portions are the same as those of the first embodiment, and the same numerals are given to the same portions and the explanation thereof is omitted.

Next, the operation of the fifth embodiment is explained.

The circuit boards 82 and 84 are used for the packet communication. In that case, similarly to the case where the antenna connection conductive member 22 and the opposite side conductive member 42 are not connected, the strength E of a radio wave for the packet communication radiated from the circuit board 82 is almost the same as the strength E of a radio wave for the packet communication radiated from the circuit board 84 (refer to FIG. 11A).

Therefore, with respect to the packet communication, almost the same antenna characteristic is shown on both the sides of the circuit board 82 and the circuit board 84. Accordingly, if the radio wave comes (is radiated) from either side, the reception (transmission) can be performed favorably, which is suitable for the packet communication.

Further, the operation during communication is the same as that in the first embodiment.

Sixth Embodiment

Figure 12:
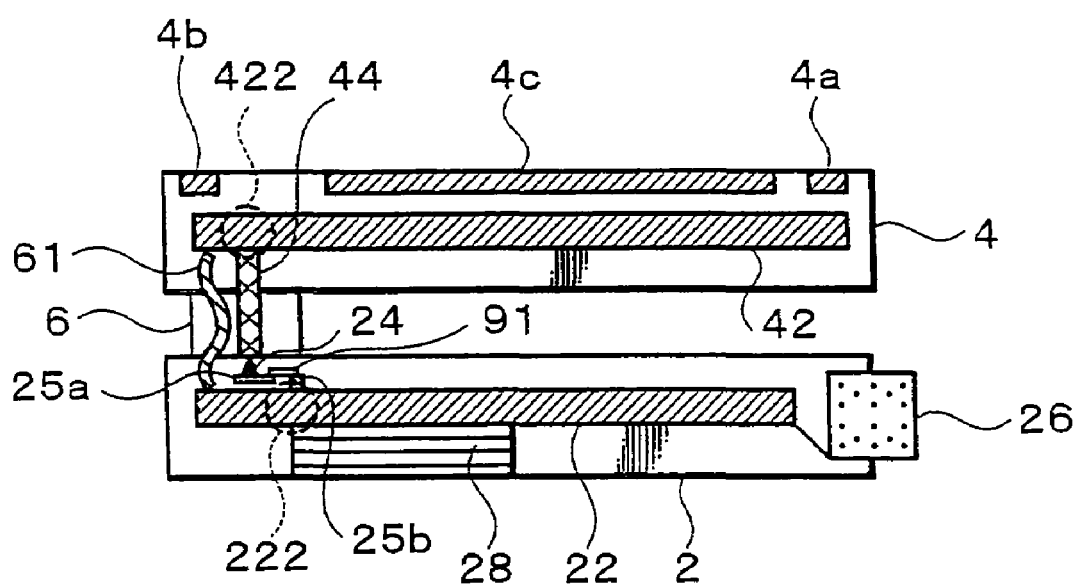
FIG. 12 is a front sectional view of a mobile phone unit according to a sixth embodiment of the present invention.

In the sixth embodiment, in a mobile phone unit (mobile communication terminal) 1 explained in the first embodiment including a key button side casing 2, an LCD side casing 4 and a hinge 6, the conduction member 22 on the side of the key button side casing 2 and the opposite side conductive member 42 on the side of the LCD side casing 4 are differently connected. FIG. 12 is a front sectional view of the mobile phone unit (mobile communication terminal) according to the sixth embodiment of the present invention.

The key button casing 2 accommodates an antenna connection conductive member 22, an electric connection portion 24, an antenna 26 and a battery 28.

The antenna connection conductive member 22 is a circuit board on which various electric circuits are mounted. The antenna 26 is connected to the antenna connection conductive member 22. Further, if the wavelength of a radio wave that the mobile phone unit 1 uses for the communication (telephone call) is $\lambda$, the electrical length of the antenna connection conductive member 22, that is, the electrical length to an edge portion 222 from a point where the antenna connection conductive member 22 and the antenna 26 are connected is $\lambda/4$.

The vicinity of the edge portion 222 of the antenna connection conductive member 22 is electrically connected to the vicinity of an opposite side edge portion 422 of the opposite side conductive member 42 through an electric connection portion 24 and a connection pattern 44. However, in this embodiment, the edge portion 222 of the antenna connection conductive member 22 is not directly connected to the electric connection portion 24. In other words, as shown in FIG. 12, one end of a frequency adjusting member 91 made of a chip component or the like is connected to a connection circuit board (conductive member) 25b disposed at a ground potential portion of the edge portion 222 of the antenna connection conductive member 22, and the other end of the frequency adjusting member 91 is connected to a connection circuit board (conductive member) 25a. Further, the connection circuit board 25a is connected to the electric connection portion 24 and is connected to (made to contact with) the connection pattern 44 from the electric connection portion 24. As the electric connection portion 24, various members usually used for the electric connection can be used as explained in the first embodiment; a coil spring, gasket and so on may also be used.

The frequency adjusting member 91 may be made of a chip component such as a coil, capacitor, resistor and so on, or a circuit in which those chip components are connected in series or in parallel, for example. However, regardless of components, the component having a comparatively small value is used in this embodiment. For example, a resistor whose resistance value is almost zero, or a capacitor whose capacitance value is 10 PF is used.

Figure 13A:
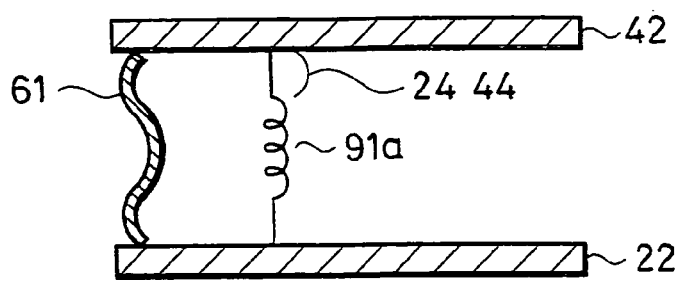
FIGS. 13A to 13E are constitutional diagrams showing connection examples of a frequency adjusting member according to the sixth embodiment of the present invention.

Specific examples are shown in FIGS. 13A to 13E, in which as shown in FIG. 13A for example, in the middle of the connection pattern 44 between the antenna connection conductive member 22 and the opposite side conductive member 42 a coil 91 is connected.

Figure 13B:
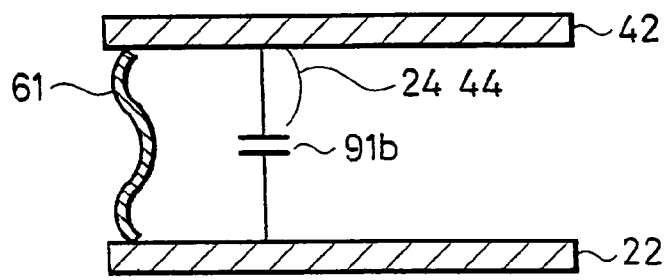

Alternatively, as shown in FIG. 13B, a capacitor 91b is connected in the middle of the connection pattern 44 between the antenna connection conductive member 22 and the opposite side conductive member 42.

Figure 13C:
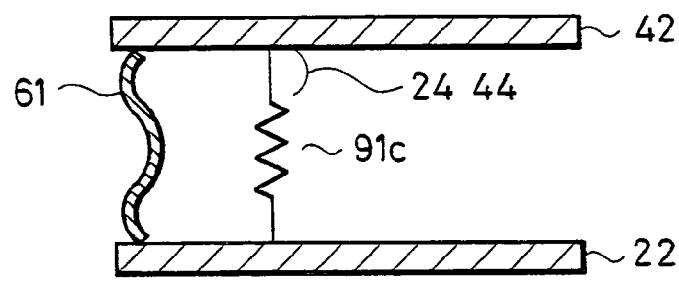

Alternatively, as shown in FIG. 13C, a resistor 91c is connected in the middle of the connection pattern 44 between the antenna connection conductive member 22 and the opposite side conductive member 42.

Figure 13D:
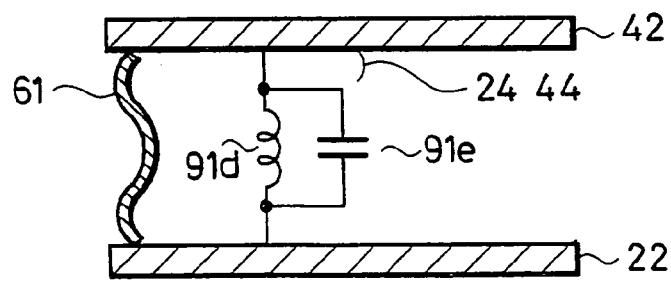

Alternatively, as shown in FIG. 13D, a parallel circuit of a coil 91d and a capacitor 91e is connected in the middle of the connection pattern 44 between the antenna connection conductive member 22 and the opposite side conductive member 42.

Figure 13E:
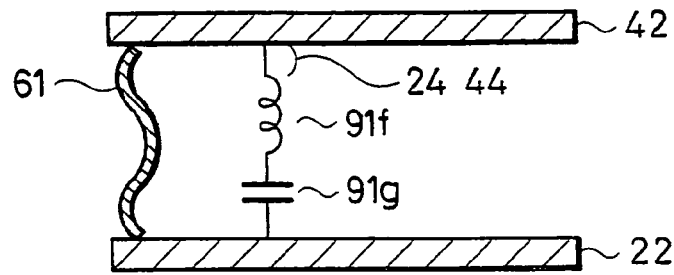

Alternatively, as shown in FIG. 13E, a series circuit of a coil 91f and a capacitor 91g is connected in the middle of the connection pattern 44 between the antenna connection conductive member 22 and the opposite side conductive member 42.

Alternatively, one chip component or a plurality of chip components other than the circuits shown in FIGS. 13A to 13E may be connected. Further, other frequency adjusting member such as an element than the chip components may be used. Note that the other portions are the same as those of the first embodiment, and the same numerals are given to the same portions and the explanation thereof is omitted.

Figure 14A:
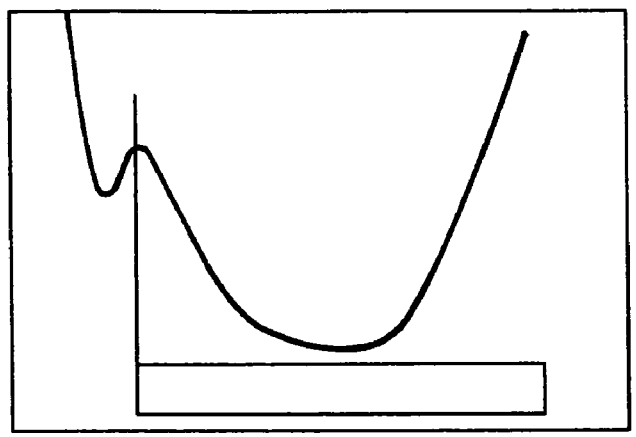
FIGS. 14A and 14B are frequency characteristic diagrams according to the sixth embodiment of the present invention, in which the characteristic without a frequency adjusting member (FIG. 14A) and the characteristic with a frequency adjusting member (FIG. 14B) are compared.
Figure 14B:
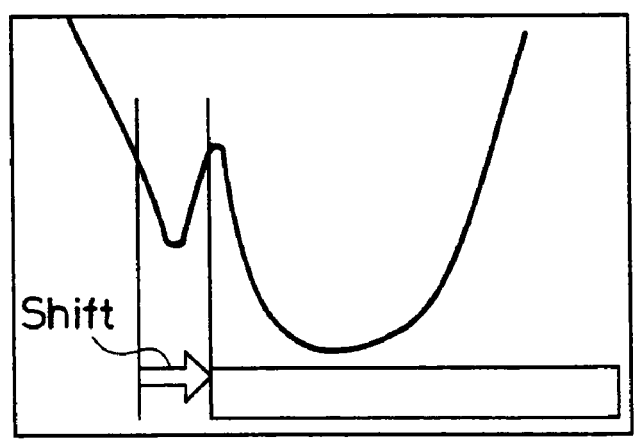

According to the configuration of the sixth embodiment as described above, the frequency band fw in which the desired antenna characteristic (characteristic of reducing SAR) shown in FIG. 7 explained in the above is obtained can be shifted. Specifically, in the case where both circuit boards 22 and 42 are connected by the connection pattern 44 in the configuration of, for example, the first embodiment, the frequency band fw in which the desired front-to-back ratio (F/B) is obtained may be the state shown in FIG. 14A. At this time, as the configuration of the present embodiment, when the frequency adjusting member 91 is connected to the connection pattern 44, the frequency band fw' in which the desired front-to-back ratio (F/B) is obtained shifts as shown in FIG. 14B. The frequency shifted can be adjusted in accordance with the characteristic of a component constituting the frequency adjusting member 91.

With being able to adjust the characteristic as described above, adjustment to the frequency band that the mobile phone unit (mobile communication terminal) 1 actually uses for the wireless communication is performed, so that the more desirable characteristic in comparison with the case of the first embodiment can be obtained. Further, in the case that selection of the position where two casings are connected is limited due to the shape of the hinge and so on and the state of the frequency characteristic set when directly connected at that position may not freely selected, the frequency characteristic is minutely adjusted and the degree of freedom for the design of the casing is improved.

The operation during communication according to this embodiment is the same as that of the first embodiment.

Seventh Embodiment

The seventh embodiment is the one in which a switch member 92 that switches the electric connection using the connection pattern 44 or the like is further provided, when the frequency adjusting member 91 explained in the sixth embodiment is connected to the connection pattern 44 through the electric connection portion 24. Specifically, as shown in FIG. 15, the vicinity of the edge portion 222 of the antenna connection conductive member 22 is electrically connected to the vicinity of the opposite side edge portion 422 of the opposite side conductive portion 42 through the electric connection portion 24 and the connection pattern 44, however, the edge portion 222 of the antenna connection conductive member 22 is not directly connected to the electric member 24, according to this embodiment.

Figure 15:
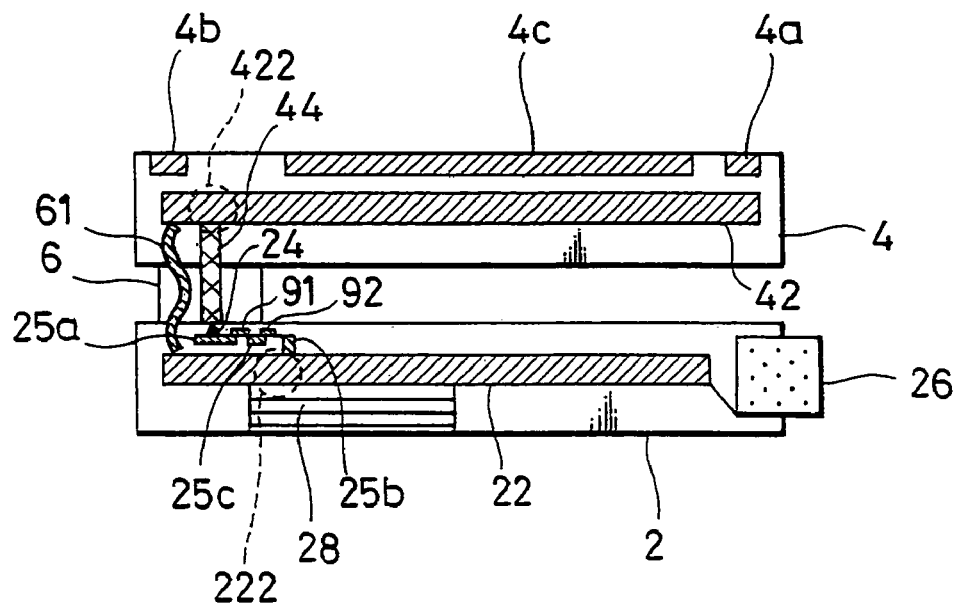
FIG. 15 is a front sectional view of an example of a mobile phone unit according to a seventh embodiment of the present invention.

Specifically, as shown in FIG. 15 for example, one end of the switch member 92 is connected to a connection circuit board (conductive member) 25b disposed at the ground potential portion of the edge portion 222 of the antenna connection conductive member 22 and the other end of the switch member 92 is connected to one end of the frequency adjusting member 91 made of the chip components or the like through a connection circuit board (conductive member) 25c, and the other end of the frequency adjusting member 91 is connected to a connection circuit board (conductive member) 25a. Further, the connection circuit board 25a is connected to the electric connection portion 24, and the electric connection portion 24 is made to connect to (contact with) the connection pattern 44.

Various switch means for switching the conduction state such as an electric switch, a mechanical switch or the like formed of various semiconductors and the like can be used as the switch member 92.

Figure 16:
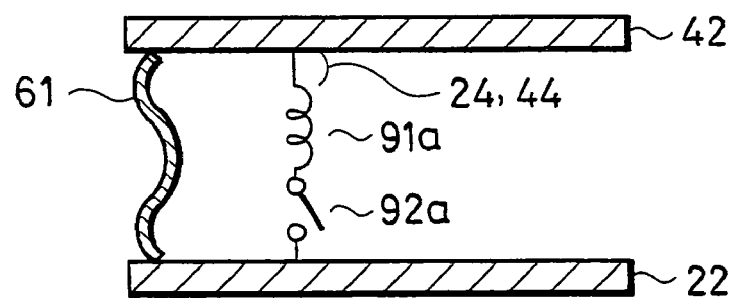
FIG. 16 is a constitutional diagram showing a connection example of a frequency adjusting member according to the seventh embodiment of the present invention.

A specific connection example is shown in FIG. 16, in which a coil 91a and a switch 92a are, for example, connected in the middle of the connection pattern 44 between the antenna connection conductive member 22 and the opposite side conductive member 42.

The switching of the switch 92a is performed by detecting the change in the relation of a relative position between the key button side casing 2 and the LCD side casing 4, for example. Specifically, with the closed state, for example, shown in FIG. 1, the connected state is selected and with the opened state shown in FIG. 2, the not-connected state is selected. Or, vice versa. Further, similarly to the example explained in the second embodiment, the switching may be performed between the time of waiting for communication and the time of communication.

Furthermore, when an electric element such as a pin diode is used as the switch member 92, the electric element may also serve as the frequency adjusting member 91 by using the value such as resistance value or the like that the element has in the conductive state. Note that the structure of other portions is the same as that of the first embodiment, and the same numerals are given to the same portions and the explanation thereof is omitted.

The operation during communication according to this embodiment is the same as the first embodiment.

The invention claimed is:

1. A mobile communication terminal comprising:
an antenna housed at least partially in a first casing;
an antenna connection conductive member housed in said first casing, and connected to said antenna;
an opposite side conductive member housed in a second casing hingedly connected to said first casing, opposed to said antenna connection conductive member; and
an electric connection member that electrically connects an edge portion of said antenna conductive member, which is on the opposite side to said antenna, to an opposite side edge portion of said opposite side conductive member, which is opposed to a vicinity of said edge portion; wherein,
said electric connection member performs no operation of connecting said edge portion and said opposite side edge portion when waiting for communication, and operation of connecting said edge portion and said opposite side edge portion during communication.

2. The mobile communication terminal according to claim 1, wherein, said electric connection member connects a ground potential portion of said antenna connection conductive member and a ground potential portion of said opposite side conductive member.

3. The mobile communication terminal according to claim 1, further comprising;

a casing which accommodates said opposite side conductive member, wherein said casing includes voice output means which outputs voice on the opposite side to said antenna connection conductive member when seen from said opposite side conductive member.

4. The mobile communication terminal according to claim 1, wherein, said electric connection member performs operation of connecting said edge portion and said opposite side edge portion and further operation of electrically connecting an edge vicinity portion in the vicinity of said edge portion in said antenna connection conductive member and an opposite side edge vicinity portion, which is opposed to said edge vicinity portion, of said opposite side conductive member, when waiting for communication, and operation of connecting said edge portion and said opposite side edge portion and no operation of connecting said edge vicinity portion and said opposite side edge vicinity portion during communication.

5. The mobile communication terminal according to claim 1, wherein, the total electrical length of said antenna connection conductive member and said opposite side conductive member is half the wavelength of a radio wave used for communication.

6. The mobile communication terminal according to claim 1, wherein, the electrical length of said antenna connection conductive member and said opposite side conductive member is quarter the wavelength of a radio wave used for communication.

7. The mobile communication terminal according to claim 1, wherein, a frequency adjusting member is attached to said electric connection member.

8. The mobile communication terminal according to claim 7, wherein, said frequency adjusting member is formed of at least one of circuit components of a resistor, capacitor and coil.

9. The mobile communication terminal comprising:

radio wave radiation means housed at least partially in a first casing;

radio wave radiation connection conductive means housed in said first casing, and connected to said radio wave radiation means;

opposite side conductive means housed in a second casing hingedly connected to said first casing, opposed to said radio wave radiation connection conductive means; and electric connection means which electrically connects a vicinity of the edge portion of said antenna conductive means, which is on the opposite side to said radio wave radiation means, to a vicinity of the opposite side edge portion of said opposite side conductive means, which is opposed to said vicinity of the edge portion; wherein, said electric connection means performs no operation of connecting said edge portion and said opposite side edge portion when waiting for communication, and operation of connecting said edge portion and said opposite side edge portion during communication.

10. A mobile communication terminal comprising:

an antenna housed at least partially in a first casing;

an antenna connection conductive member housed in said first casing, and connected to said antenna;

an opposite side conductive member housed in a second casing hingedly connected to said first casing, opposed to said antenna connection conductive member; and an electric connection member that electrically connects an edge portion of said antenna conductive member, which is on the opposite side to said antenna, to an opposite side edge portion of said opposite side conductive member, which is opposed to a vicinity of said edge portion; wherein, said electric connection member performs operation of connecting said edge portion and said opposite side edge portion and further operation of electrically connecting an edge vicinity portion in the vicinity of said edge portion in said antenna connection conductive member and an opposite side edge vicinity portion, which is opposed to said edge vicinity portion, of said opposite side conductive member, when waiting for communication, and operation of connecting said edge portion and said opposite side edge portion and no operation of connecting said edge vicinity portion and said opposite side edge vicinity portion during communication.

11. The mobile communication terminal according to claim 10, wherein, said electric connection member connects a ground potential portion of said antenna connection conductive member and a ground potential portion of said opposite side conductive member.

12. The mobile communication terminal according to claim 10, further comprising;

a casing which accommodates said opposite side conductive member, wherein said casing includes voice output means which outputs voice on the opposite side to said antenna connection conductive member when seen from said opposite side conductive member.

13. The mobile communication terminal according to claim 10, wherein said electric connection member performs no operation of connecting said edge portion and said opposite side edge portion when waiting for communication, and operation of connecting said edge portion and said opposite side portion during communication.

14. The mobile communication terminal according to claim 10, wherein, the total electrical length of said antenna connection conductive member and said opposite side conductive member is half the wavelength of a radio wave used for communication.

15. The mobile communication terminal according to claim 10, wherein, the electrical length of said antenna connection conductive member and said opposite side conductive member is quarter the wavelength of a radio wave used for communication.

16. The mobile communication terminal according to claim 10, wherein,
a frequency adjusting member is attached to said electric connection member.

17. The mobile communication terminal according to claim 10, wherein,
said frequency adjusting member is formed of at least one of circuit components of a resistor, capacitor and coil.

18. A mobile communication terminal comprising:
radio wave radiation means housed at least partially in a first casing;
radio wave radiation connection conductive means housed in said first casing, and connected to said radio wave radiation means;
opposite side conductive means housed in a second casing hingedly connected to said first casing, opposed to said radio wave radiation connection conductive means; and
electric connection means which electrically connects a vicinity of the edge portion of said antenna conductive means, which is on the opposite side to said radio wave radiation means, to a vicinity of the opposite side edge portion of said opposite side conductive means, which is opposed to said vicinity of the edge portion; wherein,
said electric connection means performs
operation of connecting said edge portion and said opposite side edge portion and further operation of electrically connecting an edge vicinity portion in the vicinity of said edge portion in said antenna connection conductive member and an opposite side edge vicinity portion, which is opposed to said edge vicinity portion, of said opposite side conductive member, when waiting for communication, and
operation of connecting said edge portion and said opposite side edge portion and no operation of connecting said edge vicinity portion and said opposite side edge vicinity portion during communication.

* * * * *